United States Patent [19]

Mitsumori et al.

[11] Patent Number: 5,550,484
[45] Date of Patent: Aug. 27, 1996

[54] APPARATUS AND METHOD FOR INSPECTING THIN FILM TRANSISTOR

[75] Inventors: Kenichi Mitsumori; Koji Kikuchi, both of Miyagi-ken, Japan

[73] Assignee: Frontec Incorporated, Sendai, Japan

[21] Appl. No.: 533,427

[22] Filed: Sep. 25, 1995

[30] Foreign Application Priority Data

Oct. 12, 1994 [JP] Japan .................................. 6-246616

[51] Int. Cl.⁶ .................................................. G01R 1/04
[52] U.S. Cl. ......................................... 324/769; 324/678
[58] Field of Search ................................. 324/73.1, 769, 324/770, 765, 678, 537, 111, 158.1; 345/87, 149, 148, 904, 87; 359/52–59; 437/8; 257/40, 48

[56] References Cited

U.S. PATENT DOCUMENTS

| | | | |
|---|---|---|---|
| 3,636,450 | 1/1972 | Griffin | 324/769 |
| 4,819,038 | 4/1989 | Alt | 324/770 |
| 5,113,134 | 5/1992 | Plus et al. | 324/770 |
| 5,179,345 | 1/1993 | Jenkins et al. | 324/678 |
| 5,377,030 | 12/1994 | Suzuki et al. | 324/770 |
| 5,428,300 | 6/1995 | Takahashi et al. | 324/769 |

FOREIGN PATENT DOCUMENTS

3-200121  9/1991  Japan .

*Primary Examiner*—Vinh P. Nguyen
*Attorney, Agent, or Firm*—Guy W. Shoup; Patrick T. Bever

[57] ABSTRACT

An apparatus and a method for inspecting a thin film transistor easily and securely with good reproducibility without adverse effect on elements of the thin film transistor even if the thin film transistor is not provided with a capacitative element. The apparatus includes an inspection signal generating device for inputting drive pulse signals and test pulse signals, respectively to a gate electrode; a test voltage generating device for inputting a test voltage to the source electrode in synchronism with the drive pulse signals; an external electrode arranged to be opposed to the drive electrode and forming therebetween a capacitance for storing test charges; and an electric signal detecting device for detecting electric signals output from the capacitance formed between the drive electrode and the external electrode to the source electrode in synchronism with test pulse signals to be input to the gate electrode.

8 Claims, 5 Drawing Sheets

※EXTERNAL ELECTRODE POTENTIAL 0 V.

FIG.6A
GATE ELECTRODE
VOLTAGE WAVEFORM

FIG.6B
SOURCE ELECTRODE
VOLTAGE WAVEFORM

FIG.6C
EXTERNAL ELECTRODE
VOLTAGE WAVEFORM

APPARATUS AND METHOD FOR INSPECTING THIN FILM TRANSISTOR

BACKGROUND OF THE INVENTION

1. Field of the Invention

The present invention relates to an apparatus and method for inspecting a pixel driving thin film transistor (hereinafter referred to as TFT) which is used for, for example, a liquid crystal display (hereinafter referred to as LCD) of an active matrix type.

2. Description of the Related Art

In recent years, in the LCD of the active matrix type which is particularly in the spotlight, a TFT is usually utilized for driving pixels thereof.

The TFT is manufactured by the use of a high-level thin film formation technique. However, it is difficult to eliminate manufacturing defects completely, and attention has been given to improvements in an apparatus and a method for inspecting the TFT.

Particularly, it is very difficult to connect terminals of the inspection apparatus directly to all of the drain electrodes or drive electrodes of the TFT, and it is regarded as important how this problem is solved.

Hence, as apparatuses for inspecting the pixel driving TFT to be used for a substrate of the LCD, following apparatuses have been used.

(a) an apparatus for measuring characteristics of an inspection TFT formed at a portion other than a display portion on the substrate (a curve tracer for use in a general transistor);

(b) an apparatus for detecting a current with a tunnel effect by bringing a detection terminal close to a transparent electrode connected to a drain electrode of the TFT; and (c) an apparatus for measuring characteristics of the TFT utilizing electro-optic effect.

According to these apparatuses and methods utilizing the same, it is not necessary to connect a terminal of the inspection apparatus directly to the drain electrode of the TFT. For this reason, however, these apparatuses have the following problems. The apparatus (a) cannot inspect the TFT of the display portion. The apparatus (b) is poor in reproducibility and accuracy. The apparatuses (b) and (c) become expensive and large-scaled, and take a very long measuring time.

An invention made to solve the above problems has been applied for a patent (Japanese Unexamined Patent Publication No. 5-90373).

The invention relates to an inspection apparatus which charges a capacitative element connected to the drain electrode of the TFT and then, measures the stored charge as voltage or as current.

However, the inspection apparatus is based on the assumption that the capacitative element is connected to the drain electrode, and has the problem that the apparatus is insufficient to the TFT in which the capacitative element is not connected to the drain electrode with respect to accuracy and reproducibility.

SUMMARY OF THE INVENTION

It is an object of the present invention to provide an inspection apparatus and an inspection method which can inspect a TFT easily and securely with good reproducibility and without adverse effect on elements of the TFT even if the TFT is not provided with the capacitative elements.

According to an aspect of the present invention, there is provided an apparatus for inspecting a thin film transistor having a drain electrode connected to a drive electrode, a source electrode separated from the drain electrode and a gate electrode located between the source electrode and the drain electrode and insulated from the source electrode and the drain electrode by an insulating film in which a current flowing between the source electrode and the drain electrode is controlled by a voltage applied to the gate electrode, the apparatus comprising: an inspection signal generation means for inputting drive pulse signals and test pulse signals, respectively to the gate electrode; a test voltage generation means for inputting a test voltage to the source electrode in synchronism with the drive pulse signals; an external electrode arranged to be opposed to the drive electrode and forming therebetween a capacitance for storing test charges; and an electric signal detection means detecting electric signals output from the capacitance formed between the drive electrode and the external electrode to the source electrode in synchronism with test pulse signals to be input to the gate electrode.

According to another aspect of the present invention, there is provided a method for inspecting a thin film transistor having a drain electrode connected to a drive electrode, a source electrode separated from the drain electrode, and a gate electrode located between the source electrode and the drain electrode and insulated from the source electrode and the drain electrode by an insulating film in which current flowing between the source electrode and the drain electrode is controlled by a voltage applied to the gate electrode, the method comprising the steps of: inputting drive pulse signals to a gate electrode and a test voltage to a source electrode in synchronism with the drive pulse signals; forming a capacitance storing test charges therein between the drive electrode and an external electrode arranged to be opposed to the drive electrode; inputting test pulse signals to the gate electrode; allowing electric signals to be output from the capacitance formed between the drive electrode and the external electrode to the source electrode; and detecting the output electric signals.

DETAILED DESCRIPTION OF THE INVENTION

Figure 1:
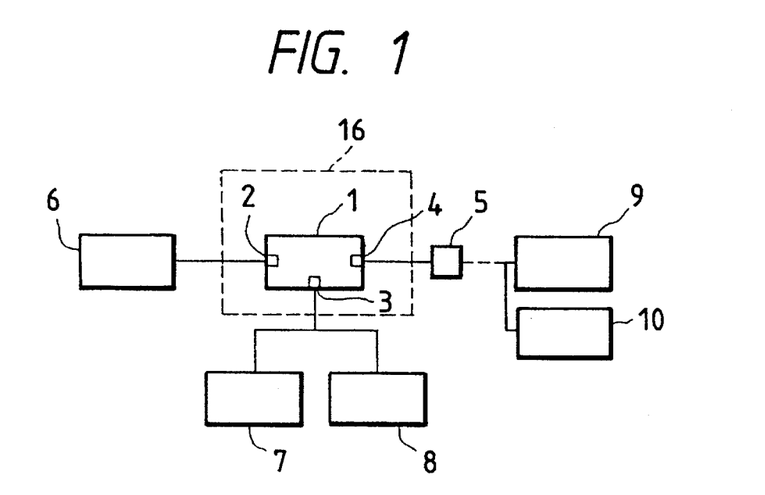
FIG. 1 is a block diagram showing one configuration of an apparatus according to the present invention.

FIG. 1 is a block diagram showing one configuration of the present invention.

Referring to FIG. 1, a TFT substrate portion 16 to be measured is shown by broken lines.

The inspection apparatus and the inspection method according to the present invention relate to a TFT 1 having a drain electrode 4 connected to a drive electrode 5, a source electrode 3 separated from the drain electrode 4, a gate electrode 2 located between the source electrode 3 and the drain electrode 4, and insulated from the source electrode 3 and the drain electrode 4 by an insulating film in which a current flowing between the source electrode 3 and the drain electrode 4 is controlled by a voltage applied to the gate electrode 2. When the inspection apparatus and method are applied to the LCD, the drive electrode 5 is a pixel electrode.

The inspection apparatus according to the present invention comprises an inspection signal generation means 6 for inputting drive pulse signals and test pulse signals to the gate electrode 2 of the TFT 1; a test voltage generation means 7 for inputting a test voltage to the source electrode 3 in synchronism with the drive pulse signals; an external electrode 9 which is arranged to be opposed to the drive electrode 5 connected to the drain electrode 4 and forms therebetween a capacitance for storing test charges; and an electric signal detection means for detecting electric signals output from the capacitance formed between the drive electrode 5 and the external electrode 9 to the source electrode 3 in synchronism with the test pulse signals to be input to the gate electrode 2.

A method for inspecting the TFT 1 utilizing the above inspection apparatus will now be described.

Firstly, the inspection signal generation means 6 is connected to the gate electrode 2 of the TFT 1 to be measured, the test voltage generation means 7 is connected to the source electrode 3 and the external electrode 9 is arranged so as to be opposed to the drive electrode 5.

Figure 2:
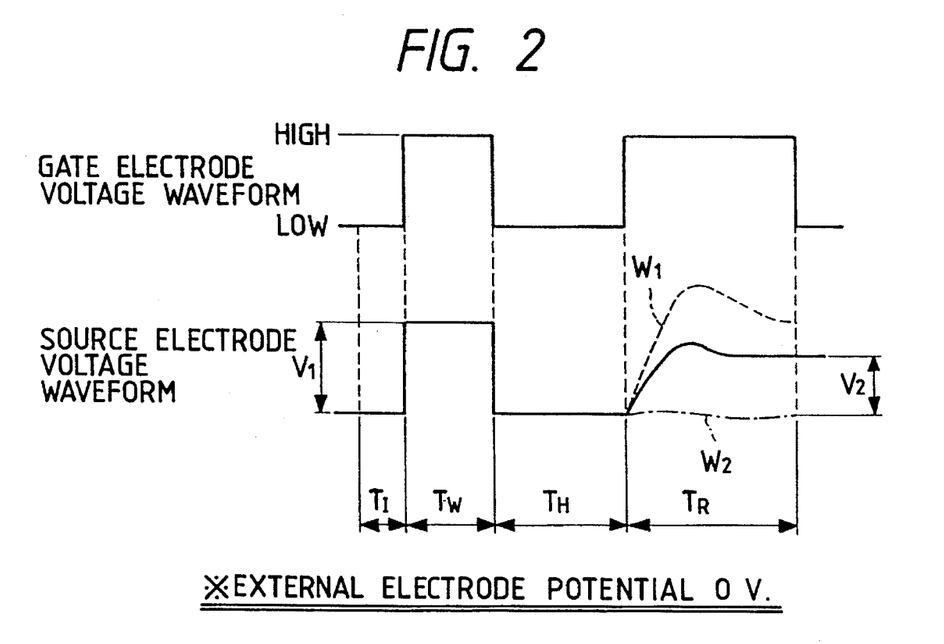
FIG. 2 is a timing chart showing examples of voltage waveforms at the gate electrode and the source electrode.

Then, as shown in FIG. 2, drive pulse signals are input to the gate electrode 2 of the TFT 1 from the inspection signal generation means 6, and a test voltage is simultaneously input to the source electrode 3 of the TFT 1 from the test voltage generation means 7 for a fixed period of time TW (a test voltage charging time), thereby storing charges in the capacitance formed between the drive electrode 5 connected to the drain electrode 4 and the external electrode 9, and holding the charges for a fixed period of time TH (a charge holding time).

At this time, if the characteristics of the TFT 1 of the TFT substrate portion 16 are normal, a fixed amount of charges are stored at all times in the capacitance to be formed between the drive electrode 5 and the external electrode 9.

However, if there is anything wrong with the characteristics of the TFT 1 of the TFT substrate portion 16, dispersion in the charges to be stored may occur and the stored charges may be discharged abnormally during the charge holding time TH.

Next, the test voltage generation means 7 is disconnected from the source electrode 3 of the TFT 1, and the electric signal detection means 8 is connected to the source electrode 3 instead.

Then, test pulse signals are input to the gate electrode 2 from the inspection signal generation means 6 for a fixed period of time TR (a charge detecting time).

At this time, electric signals discharged from the capacitance formed between the external electrode 9 and the drive electrode 5 to the source electrode 3 through a channel portion of the TFT 1 is detected by the electric signal detection means 8.

If the characteristics of the TFT 1 of the TFT substrate portion 16 are normal as in the case of charging the capacitance, a fixed amount of charges stored in the capacitance is stably discharged to the source electrode 3 through the channel portion of the TFT, and a discharge voltage V2 detected by the electric signal detection means 8 is constant at all times.

However, if there is anything wrong with the characteristics of the TFT 1 of the TFT substrate portion 16, dispersion in the charges stored in the capacitance occurs after the passage of the charge holding time TH. Thus, dispersion in the discharge voltage V2 detected by the electric signal detection means 8 occurs.

Therefore, the measurement of the discharge voltage V2 with the electric signal detection means 8 allows the characteristics of the TFT 1 to be inspected even if the capacitative element is not connected to the drain electrode 4 in the TFT 1.

In addition, as shown in FIG. 1, when an electrode potential control means 10 for controlling electrode potential of the external electrode 9 is provided to the external electrode, an application of a voltage of an inverted phase to the external electrode 9 allows a charging voltage to increase, thereby improving accuracy of the measurement.

A current detection means for detecting current signals, a voltage detection means for detecting voltage signals, or a charge detection means for detecting charge signals may be used as the electric signal detection means for detecting electric signals.

The preferred embodiments of the present invention will now be described with reference to the accompanying drawings.

First Embodiment

Figure 3:
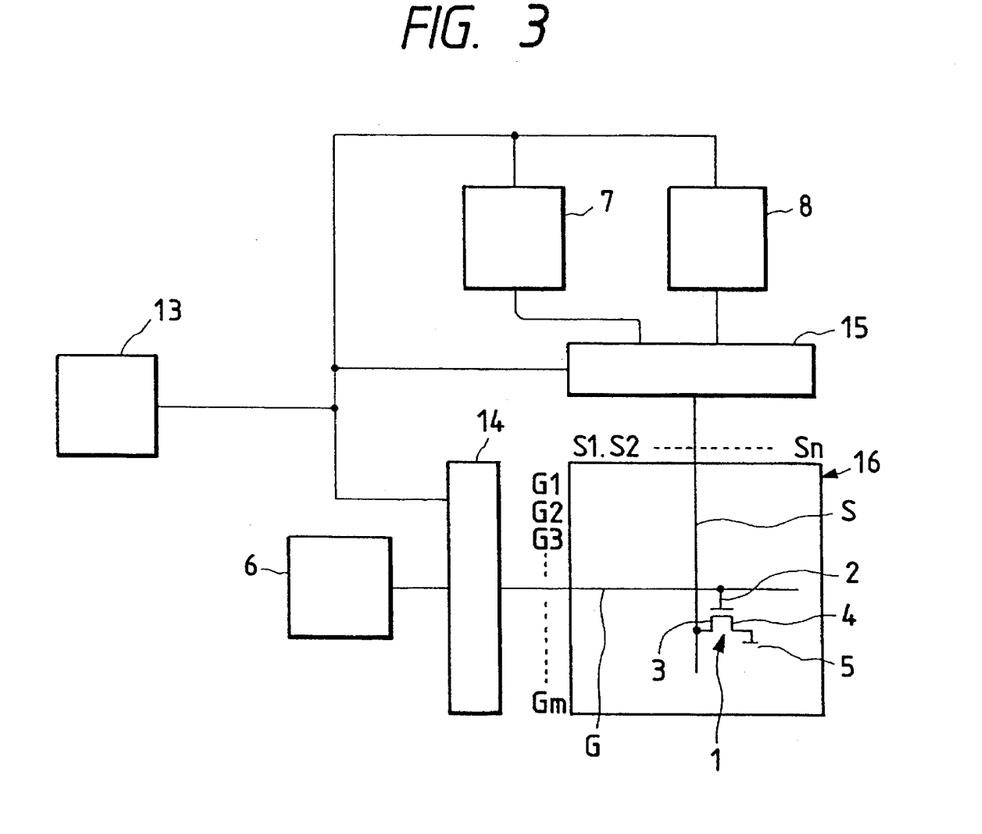
FIG. 3 is a block diagram showing a configuration of a first embodiment according to the present invention.

A TFT described in this embodiment is used for an LCD. As shown in FIG. 3, a plurality of signal lines S ($S_1$, $S_2$, ... $S_n$) and a plurality of scanning lines G ($G_1$, $G_2$, ... $G_m$) are formed on a TFT substrate portion 16 in the form of a matrix, and TFTs 1 are formed near each of the intersections of these lines.

Figure 4:
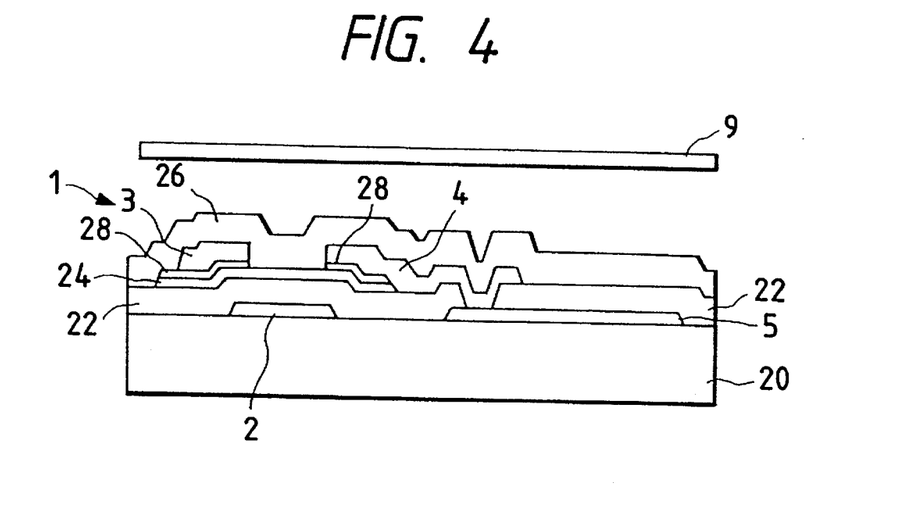
FIG. 4 is a sectional view showing a main part of a TFT substrate portion of a first embodiment according to the present invention.

The TFT 1 is, for example, one which is shown in FIG. 4. A gate electrode 2 and a pixel electrode (drive electrode) 5 are formed on a substrate 20 made of a glass or the like, and gate insulating films 22 are laminated thereon so as to cover them. A semiconductor film 24 is formed above the gate electrode 2, and a drain electrode 4 and a source electrode 3 are formed thereon separately. Ohmic films 28 are formed between the drain electrode 4 and the semiconductor film 24, and between the source electrode 3 and the semiconductor film 24, respectively. The drain electrode 4 is connected to the pixel electrode 5. A protective film 26 is formed on these components.

As shown in FIG. 3, the gate electrode 2 is connected to the scanning line G and the source electrode 3 is connected to the signal line S.

According to the TFT 1 constructed as described above, the current flowing between the source electrode 3 and the drain electrode 4 is controlled by a voltage to be applied to the gate electrode 2 due to a current passing through the scanning line G.

Further, in an inspection apparatus of this embodiment, an inspection signal generation means 6 is connected to the scanning line G which is connected to the gate electrode 2. The inspection signal generation means 6 inputs drive pulse signals and test pulse signals to the gate electrode 2.

A test voltage generation means 7 and an electric signal detection means 8 are connected to the signal line S which is connected to the source electrode 3.

The test voltage generation means 7 applies a test voltage to the source electrode 3, and the electric signal detection means 8 detects electric signals emitted to the source electrode 3. To these inspection signal generation means 6, the test voltage generation means 7 and the electric signal detection means 8, a pulse generator, a constant voltage power source, an ammeter, a voltmeter and an ampere-integrator (for detecting electric charge) can be applied.

In addition, as shown in FIG. 3, a scanning selector buffer means 14 is provided between the scanning line G and the inspection signal generation means 6, and a signal selector buffer means 15 is provided between the signal line S and the test voltage generation means 7 and the electric signal detection means 8.

The scanning selector buffer means 14 controls the drive pulse signals and the test pulse signals sent from the inspection signal generation means 6 to be applied to the scanning line G.

The signal selector buffer means 15 controls a current flowing from the test voltage generation means 7 to the signal line S, or a current flowing from the signal line S to the electric signal detection means 8.

The scanning selector buffer means 14 and the signal selector buffer means 15 are controlled by a selector control means 13 connected thereto so as to be operated.

In this embodiment, when the TFT 1 is inspected, an external electrode 9 is arranged so as to be opposed to the pixel electrode 5, as shown in FIG. 4.

The external electrode 9 is a flat plate electrode which is made up of a conductive material such as a metal. It is desirable that the external electrode 9 is arranged as close as possible to the pixel electrode 5 when inspecting the TFT 1. However, contact of the external electrode 9 with the TFT 1 may cause detect of the TFT 1. Thus, care is needed in the arrangement of the external electrode 9.

A method of inspecting the TFT 1 will now be described.

Firstly, the source electrode 3 of the TFT 1 and the test voltage generation means 7 are electrically connected by the signal selector buffer means 15. In this state, the drive pulse signals generated by the inspection signal generation means 6 are input to the gate electrode 2 of the TFT 1 to turn the connected TFT 1 to ON state. Then, a test voltage is input to the source electrode 3 from the test voltage generation means 7 for a fixed period of time TW (a test voltage writing time) in synchronism with the drive pulse signals.

By this, a test current from the test voltage generation means 7 passes from the source electrode 3 to the pixel electrode 5 through the drain electrode 4 so as to be stored between the pixel electrode 5 and the external electrode 9.

A test voltage V1 at this time is suitably established by the number of the scanning lines G, the capacitance formed between the pixel electrode 5 connected to the TFT 1 and the drain electrode 4 and the external electrode 9, resistance of lines (G or S) and capacitance of the lines (G or S) and the pixel electrodes. The voltage of V or more is preferable.

The electric signal detection means 8 is kept in an electrically insulated state by means of a switch, or the like so that it does not influence the test voltage V1.

The test voltage charging time TW is set to a sufficiently long period of time required for storing charges in the capacitance formed between the pixel electrode 5 and the external electrode 9 with good reproducibility.

That is, the test voltage charging time TW primarily depends on the number of the scanning lines G, and is established by the characteristics of the capacitance formed between the pixel electrode 5 connected to the TFT 1 and the drain electrode 4 and the external electrode 9, resistance of lines (G or S) and capacitance of the lines (G or S) and the pixel electrodes. In the case of the LCD, the TW is generally in the range from 1 μsec to 1 sec. For example, when the number of the scanning lines G is 700, the range from 10 μsec to 100 msec is preferable.

At this time, if the TFT 1 is normal, a fixed amount of charges flowing from the drain electrode 4 through a channel portion of the ON-state TFT 1 is stored. However, if there is anything wrong with the TFT 1, dispersion in the charges to be stored may occur.

Thereafter, the input of the drive pulse signals to the gate electrode 2 is stopped and the TFT 1 is turned to OFF state, thereby holding the charges between the pixel electrode 5 and the external electrode 9 for a fixed period of time TH (a charge holding time).

At this time, if the TFT 1 is normal, the stored charges are held. However, if there is anything wrong with the TFT 1, the stored charges may be discharged abnormally.

Thereafter, the source electrode 3 is disconnected from the test voltage generation means 7 by the signal selector buffer means 15, and the source electrode 3 is connected to the electric signal detection means 8 instead. And then, the test pulse signals are input to the gate electrode 2 of the TFT 1 from the inspection signal generation means 6 so as to turn the TFT 1 to ON state. This allows the charges held between the pixel electrode 5 and the external electrode 9 to be discharged from the drain electrode 4 to the source electrode 3 through a channel portion of the TFT 1. The electric signals flown to the source electrode 3 are detected by the electric signal detection means 8.

A charge detecting time TR for applying the test pulse signals to the TFT 1 so as to turn the TFT 1 to ON state is suitably established by the number of the scanning lines, the characteristics of capacitance formed between the pixel electrode 5 connected to the TFT 1 and the drain electrode 4 and the external electrode 9, resistance lines and capacitance of the lines and the pixel electrodes.

The test voltage generation means 7 is kept in an electrically insulated state by means of a switch or the like so that it does not influence a discharge voltage V2.

As in the case of charging the capacitance, if the TFT 1 and the capacitance formed between the pixel electrode 5 and the external electrode 9 are normal, a fixed amount of charge stored in the capacitance is discharged to the source electrode 3, and the discharge voltage V2 detected by the electric signal detection means 8 is constant at all times.

However, if there is anything wrong with the TFT 1 of the TFT substrate portion 16, or the capacitance formed between the pixel electrode 5 and the external electrode 9, dispersion in the amount of the charges stored in the capacitance formed between the pixel electrode 5 and the external electrode 9 may occur after the passage of the charge holding time TH, and dispersion in the discharge voltage V2 detected by the electric signal detection means 8 may occur also. Therefore, the measurement of the discharge voltage V2 with the electric signal detection means 8 allows a TFT to be inspected even if the capacitative element is not connected to the drain electrode 4 in the TFT.

For example, when the pixel electrode 5 and the scanning line G are short-circuited, a source electrode voltage waveform becomes abnormally large as shown by W1 in FIG. 2. When there is anything wrong with the source electrode 3, the drain electrode 4 and the insulating film, or when the TFT is poorly operated, the waveform becomes flat as shown by W2 in FIG. 2.

When tests were actually carried out with the use of the inspection apparatus, the following facts were confirmed. That is, in the case of using the normal TFT 1, the discharge voltage V2 detected by the electric signal detection means 8 became approximately constant at one-half of the test voltage V1 when the charge detecting time TR was 10 μsec. However, in the case of using the TFT 1 having abnormalities, the discharge voltage V2 which was detected by the electric signal detection means 8 varied in accordance with a degree of abnormality of the TFT 1 regardless of the charge detecting time TR, and was far smaller than about one-half of the test voltage V1 which is a normal value, and abnormality occurred in the pixel electrode 5 connected to the TFT 1 or the drain electrode 4 thereof.

According to another inspection apparatus, when the pixel electrode 5 connected to the TFT 1 and the drain electrode 4 thereof was normal, the discharge voltage V2 became approximately constant at about 1/50 of the test voltage V1 when the charge detecting time TR was 100 μm. On the other hand, when there was anything wrong about the pixel electrode 5, the discharge voltage V2 which was detected by the electric signal detection means 8 varied in accordance with a degree of abnormality of the pixel electrode 5 connected to the TFT 1 or the drain electrode 4 thereof regardless of the charge detecting time TR, but was far smaller than about 1/50 of the test voltage V1 which was a normal value, and abnormality occurred in the pixel electrode 5 connected to the TFT 1 or the drain electrode 4 thereof. As shown in FIG. 1, an electrode potential control means 10 for controlling electrode potential of the external electrode 9 may be also provided to the external electrode 9.

Figure 6A:
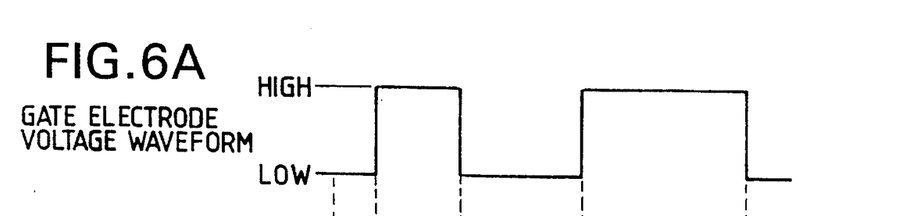
FIG. 6 is a timing chart showing voltage waveforms at the gate electrode, the source electrode and the external electrode.
Figure 6B:
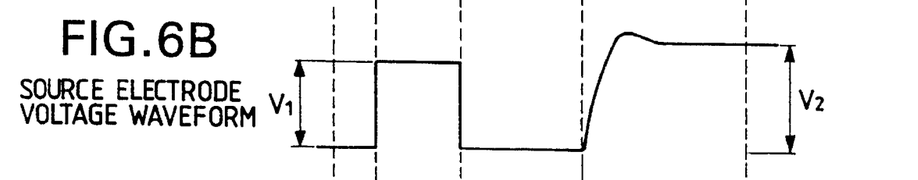
Figure 6C:
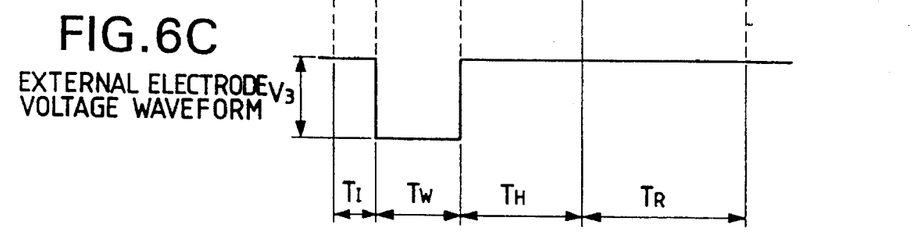

Voltage waveforms at the gate electrode 2, the source electrode 3 and the external electrode 9 when the same inspection as that described above was carried out with an inspection apparatus including the electrode potential control means 10 are shown in FIG. 6.

The application of a voltage of an inverted phase to the external electrode 9 by the electrode potential control means 10 allows a charging voltage to increase, thereby improving accuracy of the measurement.

Figure 5:
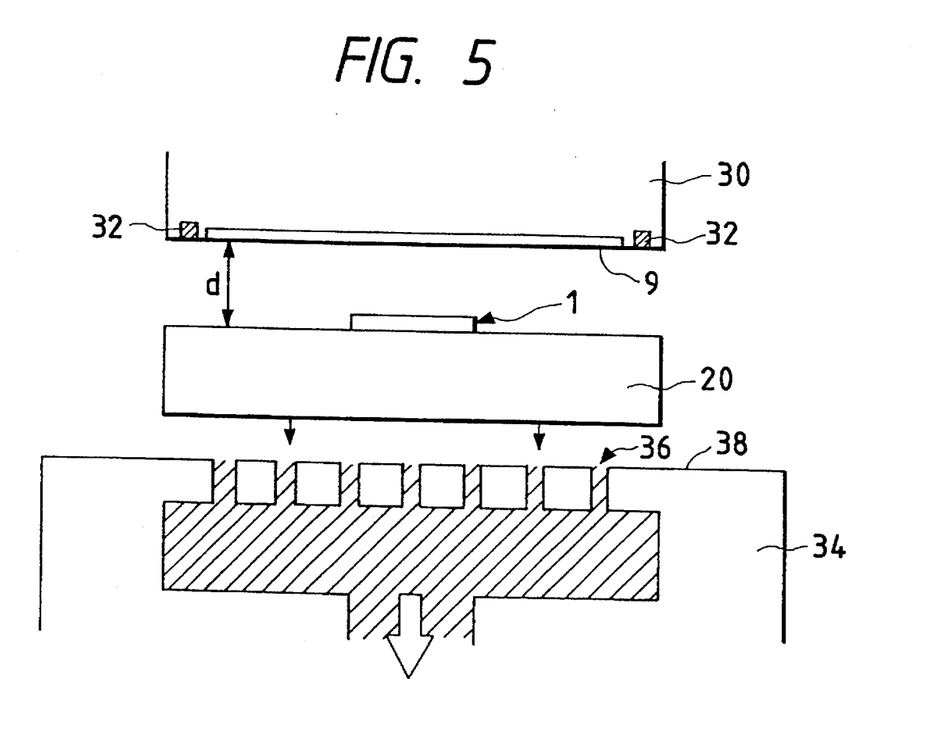
FIG. 5 is a sectional view showing an inspection method of the first embodiment according to the present invention.

For an arrangement of the external electrode 9, means shown in FIG. 5 is suitably adopted.

Firstly, the substrate 20 having the TFT formed thereon is mounted on a flat top surface 38 of a suction base 34 and then, air is sucked out downwardly from a plurality of suction holes 36 formed in the top surface of the suction base 34 to make adhere the substrate 20 to the top surface of the suction base 34, thereby forcibly flattening the substrate 20. Next, an external electrode device 30 provided with the external electrode 9 at the bottom surface thereof is brought close to the TFT 1 from above. The shorter distance between the TFT 1 and the external electrode 9 may be preferable. In practice, however, the distance d of about 20 μm may be preferable to prevent accidents due to the contact of the TFT 1 with the external electrode 9. If the external electrode device 30 is provided with distance sensors 32 detecting the distance from the substrate 20 so as to control the descent of the external electrode device 30, the distance between the external electrode 9 and the substrate 20 can be preferably maintained to a predetermined length. The distance sensors 32 may be provided not in the moving external electrode device 30 but in the suction base 34 so as to detect the distance from the external electrode device 30.

It may be possible to provide oil and the like having high conductivity between the external electrode 9 and the substrate 20 arranged adjacent to each other. In this case, however, a cleaning process is needed for removing the oil and the like.

Figure 7:
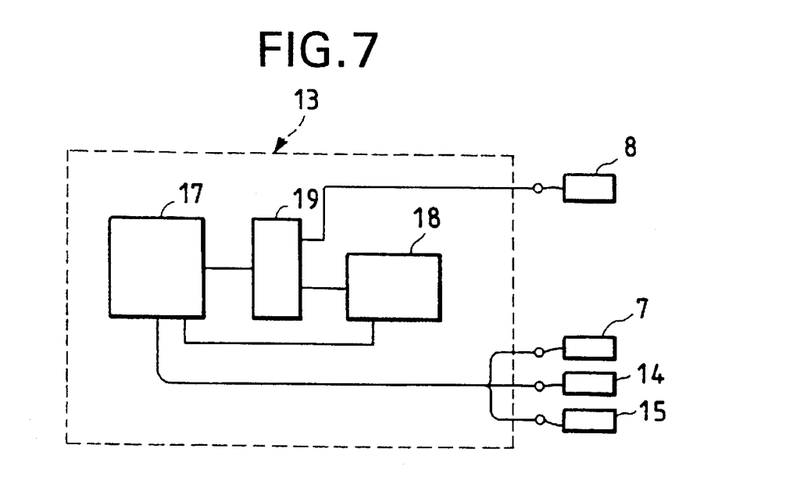
FIG. 7 is a block diagram showing an example of a selector control means.

As shown in FIG. 7, it is desirable that the selector control means 13 is comprised of a controller portion 17 for controlling the test voltage generation means 7, the electric signal detection means 8, the scanning selector buffer means 14 and the signal selector buffer means 15; a table memory portion 18 for storing decision criteria of the TFT 1; and comparison portion 19 for comparing the decision criteria with the discharge voltage V2 detected by the electric signal detection means 8.

This configuration can judge abnormalities in the voltage waveform obtained by the electric signal detection means 8 in a shorter period of time. Therefore, the configuration can offers a remarkable effect that characteristics of the TFT formed on the LCD substrate in a high density can be inspected more quickly and securely.

In this embodiment, the test voltage generation means 7 and the electric signal detection means 8 to be connected to the signal line S are switched by the signal selector buffer means 15. However, the present invention is not limited thereto. It is a matter of fact that the test voltage generation means 7 may be removed and replaced with the electric signal detection means 8 so as to be connected to the signal line S without using an electrical switch such as the signal selector buffer means 15.

According to this embodiment as described above, the TFT 1 can be inspected easily and securely with good reproducibility without making contact with the drain electrode 4 of the TFT 1 and without adverse effect on the elements thereof. Furthermore, a TFT can be inspected even if the capacitative element is not formed and connected to the TFT.

In this embodiment, a voltage signal detection means for detecting voltage signals is used as an electric signal detection means for detecting electric signals. However, the present invention is not limited thereto and a current signal detection means for detecting current signals, or a charge signal detection means for detecting charge signals may be used as the electric signal detection means.

When the voltage detection means is used, the voltage signals can be easily amplified and detection sensitivity can be further enhanced as compared with a case where the charge detection means for detecting charge signals is used.

When the external electrode 9 is a conductive material arranged to be separated from the drive electrode 5 as described in this embodiment, the capacitance formed between the drive electrode 5 and the external electrode 9 can be adjusted and measurement accuracy can be improved by controlling particularly the external electrode potential.

Second Embodiment

Figure 8:
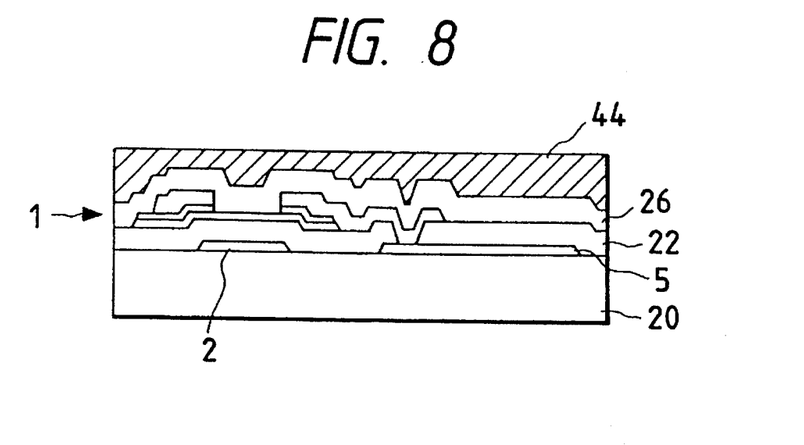
FIG. 8 is a sectional view showing a main part of TFT substrate portion of a second embodiment according to the present invention.

The inspection apparatus in this embodiment differs from the inspection apparatus in the first embodiment in that a flat plate electrode made of a metal is not used but a conductive liquid is used as the external electrode.

That is, as shown in FIG. 8, a conductive liquid 44 such as mercury and the like is provided above the TFT 1 to be used as an external electrode.

Figure 9:
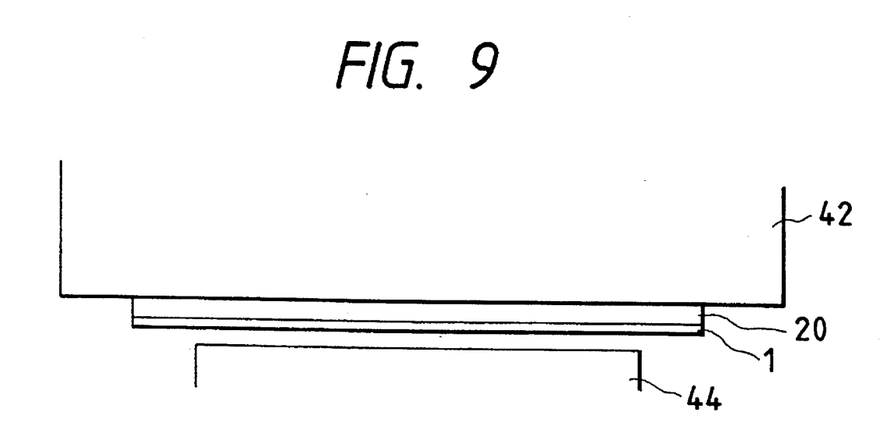
FIG. 9 is a sectional view showing an inspection method of the second embodiment according to the present invention.

Specifically, a method shown in FIG. 9 is suitable for bringing the TFT 1 into contact with the external electrode 44 made up of conductive liquid.

That is, a vessel (not shown) is filled with the conductive liquid 44 such as mercury and the like, and the TFT 1 formed on the substrate 20 which is fixed to an adsorption base 42 is dipped into the conductive liquid 44 from above.

When the conductive liquid is mercury, the surface thereof may be usually somewhat raised due to surface tension. However, the TFT 1 may be dipped into the raised portion.

The external electrode using the conductive liquid can prevent damage to the TFT 1 and the substrate 20.

The inspection apparatus of a type having a passivation film formed therein is particularly preferable because such apparatus using the conductive liquid as the external electrode can stably bring the external electrode 44 close to the drive electrode 5 so as to form capacitance with good reproducibility utilizing the constant thickness of the passivation film as a gap without damaging the surface of the substrate 20.

In one form of the invention, there is provided an apparatus for inspecting a TFT, comprising: an inspection signal generation means for inputting drive pulse signals and test pulse signals, respectively to the gate electrode; a test voltage generation means for inputting a test voltage to the source electrode in synchronism with the drive pulse signals; an external electrode arranged to be opposed to the drive electrode and forming therebetween a capacitance for storing test charges; and an electric signal detection means for detecting electric signals output from the capacitance formed between the drive electrode and the external electrode to the source electrode in synchronism with test pulse signals to be input to the electrode. This feature of the invention offers the following advantages. By the use of this apparatus, drive pulse signals are input to the gate electrode and a test voltage is input to the source electrode in synchronism with the drive pulse signals. After the formation of the capacitance storing test charges therein between the drive electrode and the external electrode, test pulse signals are input to the gate electrode and electric signals are output from the capacitance formed between the drive electrode and the external electrode to the source electrode so as to detect the output electric signals. This allows a TFT to be inspected even if a capacitative element is not connected to the TFT without connecting the terminal of the inspection apparatus to the drain electrode of the TFT.

According to the present invention, excellent reproducibility and accuracy of the measurement by this apparatus can be achieved, and the apparatus does not become large-scaled and expensive.

When the external electrode is a conductive material arranged to be separated from the drive electrode, the capacitance formed between the drive electrode and the external electrode can be adjusted and measurement accuracy can be improved by controlling particularly the external electrode potential.

In addition, when the external electrode is a conductive liquid, the TFT is not got damaged by a collision with the external electrode.

Furthermore, when the electrode potential control means for controlling electrode potential at the external electrode is provided pertaining to the external electrode, an application of a voltage of an inverted phase to the external electrode allows a voltage required for writing to increase, thereby improving accuracy of measurement by this apparatus.

Still further, when the electric signal detection means is the voltage detection means for detecting voltage signals, the voltage signals can be easily amplified, thereby further enhancing detection sensitivity.

What is claimed is:

1. An apparatus for inspecting a thin film transistor having a drain electrode connected to a drive electrode, a source electrode separated from said drain electrode and a gate electrode located between said source electrode and said drain electrode and insulated from said source electrode and said drain electrode by an insulating film in which a current flowing between said source electrode and said drain electrode is controlled by a voltage applied to said gate electrode, said apparatus comprising:

an inspection signal generation means for inputting drive pulse signals and test pulse signals, respectively to said gate electrode;

a test voltage generation means for inputting a test voltage to said source electrode in synchronism with said drive pulse signals;

an external electrode arranged to be opposed to said drive electrode and forming therebetween a capacitance for storing test charges; and an electric signal detection means for detecting electric signals output from said capacitance formed between said drive electrode and said external electrode to said source electrode in synchronism with test pulse signals to be input to said gate electrode.

2. An apparatus for inspecting a thin film transistor according to claim 1, wherein said external electrode is a conductive material arranged to be separated from said drive electrode.

3. An apparatus for inspecting a thin film transistor according to claim 1, wherein said external electrode is a conductive liquid.

4. An apparatus for inspecting a thin film transistor according to claim 1, wherein an electrode potential control means for controlling electrode potential at said external electrode is provided pertaining to said external electrode.

5. An apparatus for inspecting a thin film transistor according to claim 1, wherein said electric signals are current signals and said electric signal detection means is a current detection means.

6. An apparatus for inspecting a thin film transistor according to claim 1, wherein said electric signals are voltage signals and said electric signal detection means is a voltage detection means.

7. An apparatus for inspecting a thin film transistor according to claim 1, wherein said electric signals are charge signals and said electric signal detection means is a charge detection means.

8. A method for inspecting a thin film transistor having a drain electrode connected to a drive electrode, a source electrode separated from said drain electrode, and a gate electrode located between said source electrode and said drain electrode and insulated from said source electrode and said drain electrode by an insulating film in which current flowing between said source electrode and said drain electrode is controlled by a voltage applied to said gate electrode, said method comprising the steps of:

inputting drive pulse signals to a gate electrode and a test voltage to a source electrode in synchronism with said drive pulse signals;

forming a capacitance storing test charges therein between said drive electrode and an external electrode arranged to be opposed to said drive electrode;

inputting test pulse signals to said gate electrode;

allowing electric signals to be output from said capacitance formed between said drive electrode and said external electrode to said source electrode; and detecting said output electric signals.

* * * * *